US011711225B2

(12) United States Patent
Huang et al.

(10) Patent No.: US 11,711,225 B2
(45) Date of Patent: Jul. 25, 2023

(54) REDUCTION OF POWER-OVER-DATA-LINES (PODL) FILTER PARASITICS FOR MULTI-GIGABIT ETHERNET

(71) Applicant: Marvell Asia Pte Ltd, Singapore (SG)

(72) Inventors: Shaowu Huang, Sunnyvale, CA (US); Dance Wu, Palo Alto, CA (US)

(73) Assignee: MARVELL ASIA PTE LTD, Singapore (SG)

( * ) Notice: Subject to any disclaimer, the term of this patent is extended or adjusted under 35 U.S.C. 154(b) by 0 days.

(21) Appl. No.: 17/497,936

(22) Filed: Oct. 10, 2021

(65) Prior Publication Data

US 2022/0116236 A1 Apr. 14, 2022

Related U.S. Application Data

(60) Provisional application No. 63/091,273, filed on Oct. 13, 2020.

(51) Int. Cl.
*H04L 12/10* (2006.01)
*B60R 16/03* (2006.01)
*H03H 7/06* (2006.01)

(52) U.S. Cl.
CPC ............ *H04L 12/10* (2013.01); *B60R 16/03* (2013.01); *H03H 7/06* (2013.01)

(58) Field of Classification Search
None
See application file for complete search history.

(56) References Cited

U.S. PATENT DOCUMENTS

| 2002/0166124 A1* | 11/2002 | Gurantz | H04N 21/615 725/78 |
| 2010/0205233 A1* | 8/2010 | Morgan | H03H 7/38 708/205 |
| 2015/0295735 A1* | 10/2015 | Gardner | G06F 13/4072 307/1 |
| 2016/0054777 A1* | 2/2016 | Dwelley | G06F 1/3287 710/110 |

OTHER PUBLICATIONS

EP Application #21202399.8 Search Report dated Mar. 17, 2022.
(Continued)

*Primary Examiner* — Daniel Kessie
*Assistant Examiner* — Terrence R Willoughby

(57) ABSTRACT

An apparatus for filtering an electrical power signal in an Ethernet communication system includes a link interface, a power interface, and a filter connected between the link interface and the power interface. The link interface is configured to connect to an Ethernet link. The power interface is configured to connect to one or both of (i) a power-supply that supplies the electrical power signal for transfer over the Ethernet link, and (ii) a circuit that consumes the electrical power signal transferred over the Ethernet link. The filter includes at least (i) a primary inductor configured to filter the electrical power signal transferred to or from the Ethernet link, and (ii) one or more complementary inductors connected in series with the primary inductor, the one or more complementary inductors configured to reduce a parasitic capacitance of the filter.

19 Claims, 2 Drawing Sheets

(56) References Cited

OTHER PUBLICATIONS

IEEE Standard 802.3bu-2016, "IEEE Standard for Ethernet—Amendment 8: Physical Layer and Management Parameters for Power over Data Lines (PoDL) of Single Balanced Twisted-Pair Ethernet," IEEE Computer Society, pp. 1-77, Dec. 2016.

IEEE standard 802.3ch-2020, "IEEE Standard for Ethernet—Amendment 8: Physical Layer Specifications and Management Parameters for 2.5 GB/s, 5 GB/s, and 10 GB/s Automotive Electrical Ethernet," IEEE Computer Society, Sections 149.7 and 149.8., pp. 162-170, Jun. 2020.

* cited by examiner

REDUCTION OF POWER-OVER-DATA-LINES (PODL) FILTER PARASITICS FOR MULTI-GIGABIT ETHERNET

CROSS-REFERENCE TO RELATED APPLICATIONS

This application claims the benefit of U.S. Provisional Patent Application 63/091,273, filed Oct. 13, 2020, whose disclosure is incorporated herein by reference.

FIELD OF THE DISCLOSURE

The present disclosure relates generally to communication networks, and particularly to delivery of electrical power over communication links.

BACKGROUND

In various communication networks, electrical power is delivered to communication devices over the same physical links used for data communication. In twisted-pair 100BASE-T1 and 1000BASE-T1 Ethernet networks, for example, this sort of power delivery is referred to as Power over Data Lines (PoDL). PoDL is specified, for example, in IEEE Standard 802.3bu™-2016, entitled "IEEE Standard for Ethernet—Amendment 8: Physical Layer and Management Parameters for Power over Data Lines (PoDL) of Single Balanced Twisted-Pair Ethernet," December, 2016, which is incorporated herein by reference.

The description above is presented as a general overview of related art in this field and should not be construed as an admission that any of the information it contains constitutes prior art against the present patent application.

SUMMARY

An embodiment that is described herein provides an apparatus for filtering an electrical power signal in an Ethernet communication system. The apparatus includes a link interface, a power interface, and a filter connected between the link interface and the power interface. The link interface is configured to connect to an Ethernet link. The power interface is configured to connect to one or both of (i) a power-supply that supplies the electrical power signal for transfer over the Ethernet link, and (ii) a circuit that consumes the electrical power signal transferred over the Ethernet link. The filter includes at least (i) a primary inductor configured to filter the electrical power signal transferred to or from the Ethernet link, and (ii) one or more complementary inductors connected in series with the primary inductor, the one or more complementary inductors configured to reduce a parasitic capacitance of the filter.

In some embodiments, the link interface is configured to be connected to a Media Dependent Interface (MDI) that couples the Ethernet link to an Ethernet physical layer (PHY) transceiver.

In an example embodiment, the one or more complementary inductors include a single complementary inductor. In another embodiment, the one or more complementary inductors include multiple complementary inductors connected in series to one another. In a disclosed embodiment, the filter further includes a resistor, which is connected in parallel with the primary inductor, or in parallel with one of the complementary inductors, the resistor configured to suppress resonance effects in the filter.

In some embodiments, a ratio between an inductance of the primary inductor and an inductance of any of the complementary inductors is at least five. In some embodiments, the ratio is at least ten.

In some embodiments, the Ethernet link includes a twisted-pair link having a first conductor and a second conductor, and the filter includes (i) a first section, which includes the primary inductor and the one or more complementary inductors, the first section configured to be coupled to the first conductor, and (ii) a second section, which includes an additional primary inductor and one or more additional complementary inductors that match the primary inductor and the one or more complementary inductors, respectively, the second section configured to be coupled to the second conductor. In an embodiment, the first section and the second section are disposed on a same substrate.

In some embodiments, an automotive Ethernet communication device includes (i) a physical-layer (PHY) Ethernet transceiver configured to communicate Ethernet signals over the Ethernet link, and (ii) the disclosed apparatus. In some embodiments, an automotive Ethernet network includes the disclosed automotive Ethernet communication device.

There is additionally provided, in accordance with an embodiment that is described herein, a method for filtering an electrical power signal in an Ethernet communication system. The method includes receiving the electrical power signal from a power-supply that supplies the electrical power signal for transfer over the Ethernet link, or providing the electrical power signal to a circuit that consumes the electrical power signal transferred over the Ethernet link. A filter, which includes at least a primary inductor and one or more complementary inductors connected in series with the primary inductor, is applied to the electrical power signal, including (i) filtering the electrical power signal by the primary inductor, and (ii) reducing a parasitic capacitance of the filter by the one or more complementary inductors.

The present disclosure will be more fully understood from the following detailed description of the embodiments thereof, taken together with the drawings in which:

DETAILED DESCRIPTION OF EMBODIMENTS

Figure 1:
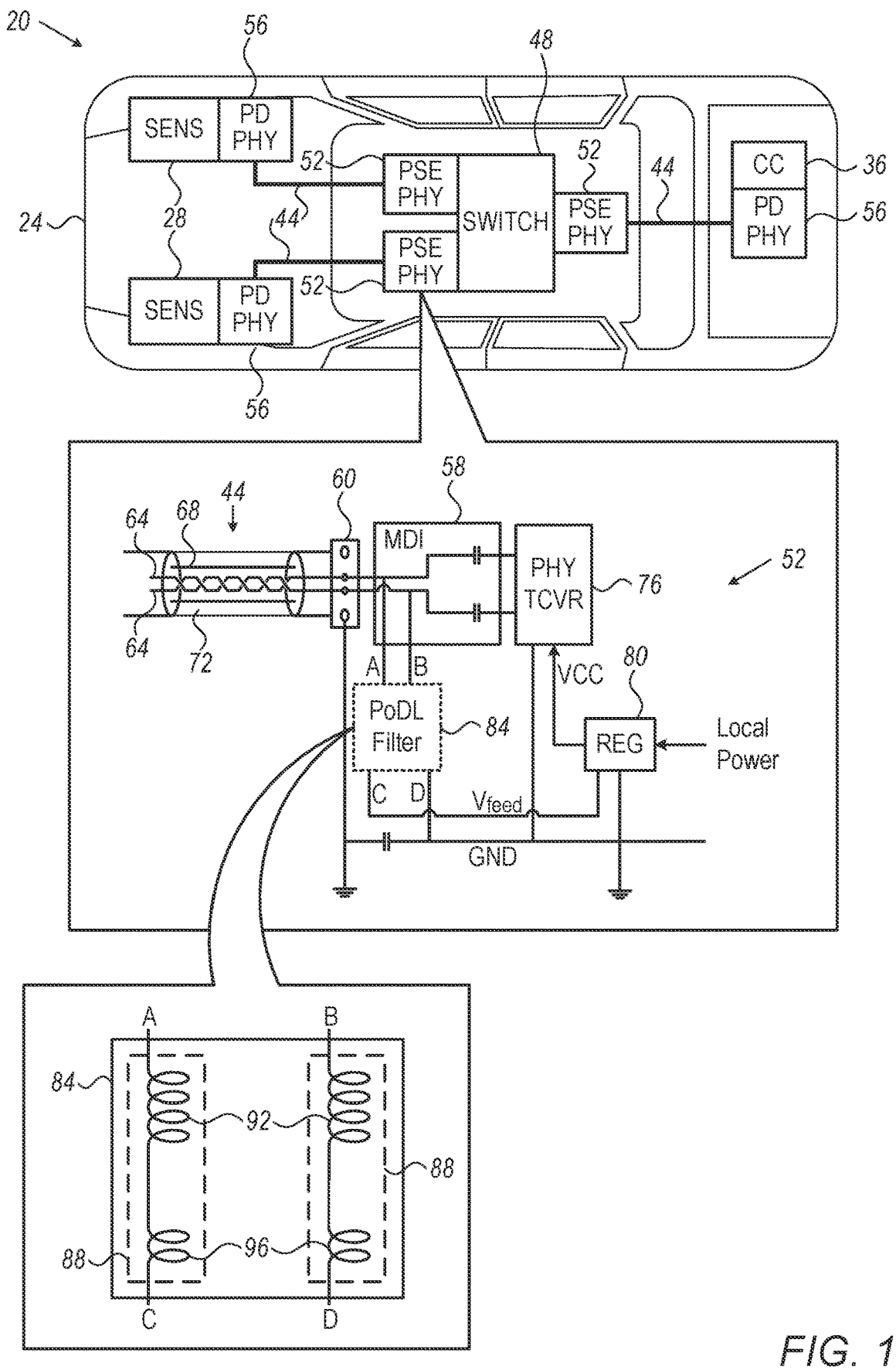
FIG. 1 is a block diagram that schematically illustrates an automotive communication system that uses Power-over-Data-Lines (PoDL) power delivery, in accordance with an embodiment that is described herein.

In an Ethernet link that uses PoDL, one communication device (referred to as a Power Sourcing Equipment—PSE) applies an electrical power signal to one end of the link. A communication device at the opposite end of the link (referred to as a Powered Device—PD) receives the electrical power signal from the link and uses it to power its circuitry. PoDL eliminates a considerable amount of heavy and expensive electrical cabling, making it highly attractive for use in automotive networks, for example.

One of the prime challenges in PoDL is the need to filter the electrical power signal with minimal effect on communication performance. For example, in a typical implementation a PoDL filter is coupled to a Media Dependent Interface (MDI) that connects the end of the link to an Ethernet physical layer (PHY) device. The PoDL filter is typically required to meet specified Electro-Magnetic Compatibility (EMC) requirements, e.g., signal/noise coupling ratios and power-conversion ratios. At the same time, to maintain adequate signal integrity, the MDI is required to meet specified return-loss and insertion-loss levels. Example requirements are set, for example, in IEEE standard 802.3ch-2020, entitled "IEEE Standard for Ethernet—Amendment 8: Physical Layer Specifications and Management Parameters for 2.5 Gb/s, 5 Gb/s, and 10 Gb/s Automotive Electrical Ethernet," June, 2020, sections 149.7 and 149.8.

Both signal integrity and EMC performance deteriorate dramatically with increasing data rate, frequency and bandwidth. Therefore, PoDL filtering is particularly difficult in multi-Gigabit Ethernet, e.g., in 2.5 Gb/s, 5 Gb/s and 10 Gb/s links. It has been found that the parasitic capacitance of the filter is a major limiting factor in achieving high-performance PoDL filtering. For example, for a PoDL filter consisting of a series inductor, simulations show that the minimum allowable inductance and the maximum allowable parasitic capacitance of the inductor are ~4 µH and ~0.7 pF, respectively. Inductors having this performance are extremely difficult to implement with low-cost and small-size, e.g., in Surface-Mount Technology (SMT).

Embodiments that are described herein provide improved PoDL filters that achieve both high-performance filtering and minimal degradation in communication performance. At the same time, the disclosed filters are suitable for SMT implementation, and therefore have a small form-factor and can be mass-produced with low cost. The disclosed PoDL filter configurations are described herein in the context of automotive Ethernet networks, solely by way of example. The disclosed filters and associated techniques are applicable and useful in various other suitable systems and applications, for example in industrial networks and home networks.

In some embodiments described herein, a filtering device is configured to filter an electrical power signal before it is applied to an Ethernet link (e.g., in a PSE), and/or to an electrical power signal that has been received from an Ethernet link (e.g., in a PD). When installed in a PSE, the filtering device is typically connected between the link and a power supply that produces the electrical power signal. When installed in a PD, the filtering device is typically connected between the link and a circuit that consumes the electrical power signal.

In an embodiment, the filtering device comprises a link interface for connecting to the link (e.g., to the MDI of the link), a power interface for connecting to the power supply or to the power-consuming circuit, and a filter connected between the link interface and the power interface. The filter comprises at least a primary inductor and one or more complementary inductors connected in series with the primary inductor. The primary inductor is configured to filter the electrical power signal. The complementary inductor or inductors are configured to reduce the parasitic capacitance of the filter.

In an example implementation, the inductance of each complementary inductor is an order of magnitude smaller than the inductance of the primary inductor. Since the primary and complementary inductors are connected in series, their total equivalent parasitic capacitance is smaller than the smallest parasitic capacitance of any individual inductor. Therefore, by using complementary inductor(s), it is possible to achieve a small total parasitic capacitance even when the individual parasitic capacitance of the primary inductor is relatively large, e.g., above 0.7 pF. The filter can thus be implemented using small and low-cost inductors. As an added benefit, the inductance of the complementary inductor increases the total equivalent inductance of the filter, thereby improving the filtering performance.

In some embodiments the filter further comprises a resistor, which is connected in parallel with one of the inductors (primary or complementary). The resistor is configured to suppress resonance effects in the filter. The added resistor also provides more freedom in choosing the inductor values.

In some embodiments, the Ethernet link is a twisted-pair link having two conductors. The filter in such embodiments typically comprises two parallel sections, each connected to one of the conductors of the twisted pair. Each section comprises a primary inductor, one or more complementary inductors, and in some embodiments a resistor. The two sections are typically matched in inductance, e.g., fabricated on the same substrate with matching component values.

Several example filter configurations are described herein. Example simulation results that illustrate the achievable filter performance are provided in U.S. Provisional Patent Application 63/091,273, cited above and incorporated herein by reference. The simulation results show, inter alia, that the high-frequency performance (in the hundreds of MHz to GHz range) is dramatically improved by adding one complementary inductor to reduce the parasitic capacitance. Without a parallel resistor, a narrow-band resonance can be noticed, caused by interactions between inductors. Addition of a parallel resistor flattens and eliminates this resonance effect, without degrading the performance at other frequencies. A filter with two inductors and one resistor is sufficient for complying with the requirements of the IEEE 802.3ch-2020 standard. Higher performance at the GHz range can be achieved by adding one additional inductor, i.e., using a filter having three inductors and one resistor.

FIG. 1 is a block diagram that schematically illustrates an automotive communication system 20 that uses Power-over-Data-Lines (PoDL) power delivery, in accordance with an embodiment that is described herein. System 20 is installed in a vehicle 24, and comprises multiple sensors 28 and a Central Computer (CC) 36. In various embodiments, sensors 28 may comprise any suitable types of sensors. Several non-limiting examples of sensors comprise video cameras, velocity sensors, accelerometers, audio sensors, infra-red sensors, radar sensors, lidar sensors, ultrasonic sensors, rangefinders or other proximity sensors, and the like.

In some embodiments, sensors 28 communicate with CC 36 over an Ethernet network that comprises an Ethernet switch 48 and a plurality of Ethernet links. Each Ethernet link comprises a PSE physical layer (PHY) device 52, a physical link 44 (also referred to as a network cable, in the present example a twisted-pair cable) and a PD PHY device 56. In a given Ethernet link, PSE PHY 52 applies an electrical power signal to physical link 44, and PD PHY 56 is powered by this electrical power signal. In the present example, PD PHYs 56 are coupled to sensors 28, so as to eliminate (i) power-supply circuitry at each sensor and (ii) power-supply cabling to reach each sensor. In this example CC 36 is also coupled to a PD PHY 56, by way of example. The opposite ends of physical links 44 (the ends connected to the ports of switch 48) are coupled to respective PSE PHY devices 52.

The network configuration shown in FIG. 1 is a highly simplified configuration that is depicted solely for demonstrating the deployment of PoDL using PSE-side and PD-side PHY devices. In alternative embodiments, any other suitable configuration can be used. For example, the choice as to which PHY device is to be a PSE PHY 52 and which PHY device is to be a PD PHY 56 can be made per each individual link, as appropriate. As another example, not all the links in the network necessarily employ PoDL.

In various embodiments, PHY devices 52 and 56 of system 20 may communicate over network cables 44 at any suitable bit rate. Example bit rates are 2.5 Gb/s, 5 Gb/s, and 10 Gb/s in accordance with IEEE 802.3ch-2020. An inset in the middle of FIG. 1 illustrates the internal structure of PSE PHY 52, in accordance with an embodiment. In the present example, cable 44 is a twisted-pair cable that comprises (i) two signal conductors 64, (ii) an inner shield layer 68 (e.g., a foil wrap) and (iii) an outer shield layer 72 (e.g., a metallic mesh braid). PSE PHY 52 comprises a PHY transceiver (TCVR) 76 that transmits and receives Ethernet signals to and from a PD PHY device 56 (not seen in this figure) over cable 44. PHY 52 further comprises a Media-Dependent Interface (MDI) 58 that connects transceiver 76 to twisted-pair cable 44 via a connector 60.

In an embodiment, PSE PHY 52 comprises a voltage regulator 80 that produces electrical power signals for powering both the local circuitry and the remote circuitry on the far side of cable 44. In the present example, regulator 80 produces a voltage denoted VCC for powering local PHY transceiver 76, and another voltage Vfeed (also referred to as an "electrical power signal") that is to be applied to cable 44 in accordance with PoDL. In the case of a twisted-pair cable, Vfeed is to be applied as a differential voltage between conductors 64.

In the embodiment of FIG. 1, PSE PHY 52 further comprises a PoDL filtering device 84, which is connected between regulator 80 and MDI 58. Filtering device 84 is configured to filter the electrical power signal (voltage Vfeed) before it is applied to the Ethernet link.

Another inset, at the bottom of FIG. 1, illustrates the structure of PoDL filtering device 84, in accordance with an embodiment. In the present example, PoDL filtering device 84 comprises four terminals denoted A, B, C and D. Terminals A and B serve as a link interface for connecting to the Ethernet link. Terminals C and D serve as a power interface, for connecting to the power supply circuitry that generates the electrical power signal to be filtered. Device 84 comprises two parallel sections 88, each section 88 connected (via MDI 58) to one of conductors 64 of cable 44.

In Some embodiments, PoDL filtering device 84 is implemented as a packaged four-terminal SMT device, e.g., a Multi-Chip Module (MCM). In these embodiments, terminals A, B, C and D comprise SMT balls or pads. In alternative embodiments, PoDL filtering device 84 is implemented at board-level. In these embodiments, the various components of the filtering device are mounted on a common Printed Circuit Board (PCB).

Sections 88 are typically matched in inductance, e.g., have matching inductance values and layouts, and fabricated on the same substrate. Alternatively, any other suitable implementation can be used. For example, an alternative filtering device may be single-ended, having only a single section 88.

Each section 88 comprises a primary inductor 92 and one or more complementary inductors (in the present example a single complementary inductor 96). The cascade of primary inductor 92 and one or more complementary inductors 96 acts as a filter, in the present example a Low-Pass Filter (LPF), which filters the electrical power signal. As will be explained in detail below, this configuration is highly effective in achieving a filter having a very low total equivalent parasitic capacitance.

FIGS. 2A-2D are circuit diagrams of PoDL filters, in accordance with example embodiments that are described herein. Any of the PoDL filters depicted in FIGS. 2A-2D can be used, for example, to implement a section 88 in filtering device 84 of FIG. 1. Alternatively, any of the disclosed PoDL filters can be used to implement a standalone, single-ended filtering device.

Figure 2B:
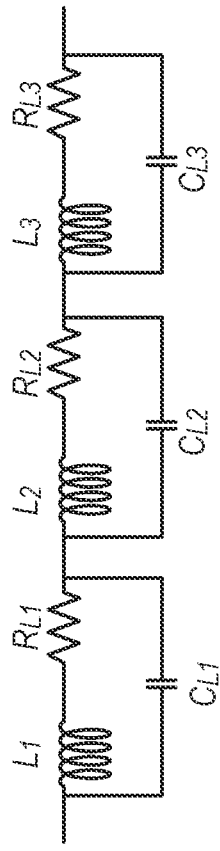
FIGS. 2A-2D are circuit diagrams of PoDL filters, in accordance with example embodiments that are described herein.
Figure 2D:
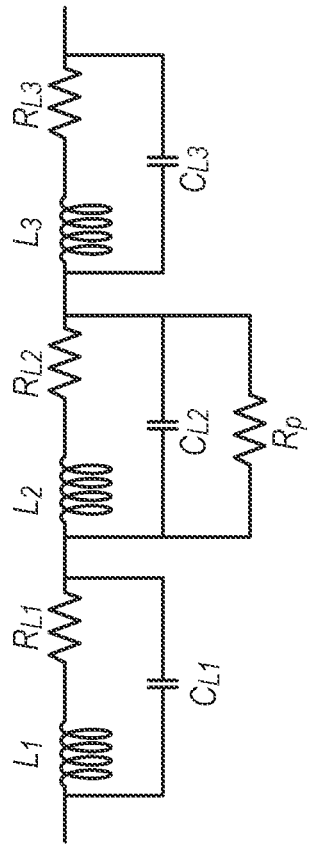
Figure 2A:
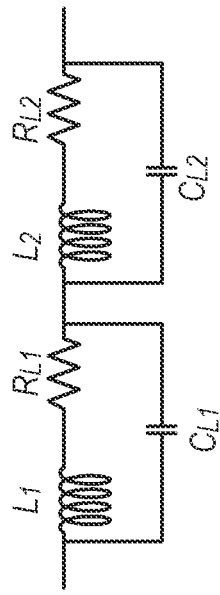

FIG. 2A illustrates a PoDL filter comprising a primary inductor $L_1$ and a single complementary inductor $L_2$. The parasitic capacitance of $L_1$ is denoted $C_{L1}$, and the Ohmic resistance of $L_1$ is denoted $R_{L1}$. Similarly, the parasitic capacitance of $L_2$ is denoted $C_{L2}$ and the Ohmic resistance of $L_2$ is denoted $R_{L2}$.

In one example embodiment, the inductance of the primary inductor $L_1$ is 4 pH, and the inductance of the complementary inductor $L_2$ is 0.5 pH. When inductors $L_1$ and $L_2$ are implemented using SMT, their parasitic capacitances are typically on the order of 2 pF and 0.5 pF, respectively. The resistances of $L_1$ and $L_2$ in this example ($R_{L1}$ and $R_{L2}$) are typically on the order of 10 mΩ.

Since the primary and complementary inductors are connected in series, their total equivalent parasitic capacitance is smaller than the smallest parasitic capacitance of any individual inductor. Therefore, the inductance of $L_2$ is typically chosen to be considerably smaller than that of $L_1$. Typically, although not necessarily, the ratio between the inductances of $L_1$ and $L_2$ is set to be at least 5, and in some embodiments at least 10. All the numerical values given above are chosen purely by way of example. Alternatively, any other suitable inductances can be used.

FIG. 2B illustrates an alternative PoDL filter comprising a primary inductor $L_1$ and two complementary inductor $L_2$ and $L_3$, all connected in series to one another. The parasitic capacitance of $L_3$ is denoted $C_{L3}$, the Ohmic resistance of $L_3$ is denoted $R_{L3}$. In one embodiment, the inductances, parasitic capacitances and resistances of $L_1$ and $L_2$ are the example values given in FIG. 2A above. The inductance of the additional complementary inductor $L_3$ is 0.125 pH, the parasitic capacitance of $L_3$ is on the order of 0.1 pF, and the resistance of $L_3$ is on the order of 10 mΩ.

Figure 2C:
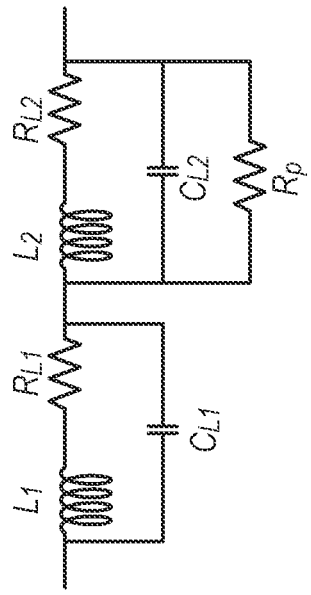

FIG. 2C illustrates yet another PoDL filter, in accordance with an alternative embodiment. In this example, the PoDL filter is similar to that of FIG. 2A, and further comprises a resistor $R_p$ connected across (in parallel with) the complementary inductor $L_2$. The resistance of $R_p$ is typically on the order of 500Ω, although any other suitable value can be used.

Generally, a resistor of this sort can be connected across any of the inductors of the PoDL filter (primary or complementary), or across more than one of the inductors. The additional resistor reduces resonance effects, which may result from interaction between inductors. Such resonant effects may distort the filter response, e.g., introduce unwanted peaks or dips into the filter's transfer function or return loss in the frequency domain. Examples of this sort of distortion, and of its suppression by resistor $R_p$, are given in U.S. Provisional Patent Application 63/091,273, cited above.

FIG. 2D illustrates still another PoDL filter, in accordance with an embodiment. The PoDL filter of FIG. 2D is similar to that of FIG. 2B, and further comprises a resistor $R_p$ connected across (in parallel with) the complementary inductor $L_2$. The resistance of $R_p$ is typically on the order of 500Ω, although any other suitable value can be used. In this configuration, the additional resistor is connected across the middle inductor in the cascade. This configuration is chosen in some embodiments, although not necessarily, because the parallel resistor suppresses the resonances, dampens the resonant peaks in return loss as well the resonant dips in insertion loss.

The configurations of system 20, the various PHY devices 52 and 56 and their components such as filtering device 84 shown in FIG. 1, as well as the various PoDL filters shown in FIGS. 2A-2D, are example configurations that are depicted solely by way of example. In alternative embodiments, any other suitable configurations can be used. For example, in an alternative embodiment, a PoDL filtering device such as device 84 can be installed in PD-side PHY devices 56 (additionally or alternatively to PSE PHY devices 52).

As another example, the disclosed PoDL filters or filtering devices can be integrated in the respective PHY device. As noted above, the disclosed PoDL filters or filtering devices can be implemented at package-level (e.g., in an MCM) or at board-level (i.e., on a common PCB). In yet other embodiments, the disclosed PoDL filters or filtering devices can be implemented using a hybrid packaged/board-level implementation.

The various elements of system 20 and its components, e.g., PHY devices 52 and 56 and their components such as filtering device 84 shown in FIG. 1, as well as the various PoDL filters shown in FIGS. 2A-2D, may be implemented using any suitable hardware, e.g., using discrete components or in a packaged SMT device.

Although the embodiments described herein mainly address PoDL, the methods and systems described herein can also be used in other applications, such as in Power-over-Coax (PoC), Power-over-Ethernet (PoE), as well as other suitable types of high-speed interfaces with power delivery over the associated data conductors.

It is noted that the embodiments described above are cited by way of example, and that the present invention is not limited to what has been particularly shown and described hereinabove. Rather, the scope of the present invention includes both combinations and sub-combinations of the various features described hereinabove, as well as variations and modifications thereof which would occur to persons skilled in the art upon reading the foregoing description and which are not disclosed in the prior art. Documents incorporated by reference in the present patent application are to be considered an integral part of the application except that to the extent any terms are defined in these incorporated documents in a manner that conflicts with the definitions made explicitly or implicitly in the present specification, only the definitions in the present specification should be considered.

The invention claimed is:

1. An apparatus for filtering an electrical power signal in an Ethernet communication system, the apparatus comprising:
   a link interface, configured to connect to an Ethernet link;
   a power interface, configured to connect to one or both of (i) a power-supply that supplies the electrical power signal for transfer over the Ethernet link, and (ii) a circuit that consumes the electrical power signal transferred over the Ethernet link; and
   a filter, which is connected between the link interface and the power interface, the filter comprising at least:
      a primary inductor, configured to filter the electrical power signal transferred to or from the Ethernet link;
      at least two complementary inductors connected in series with the primary inductor, the at least two complementary inductors configured to reduce parasitic capacitance of the filter; and resistor, which is connected across the primary inductor, or across one of the at least two complementary inductors, the resistor configured to suppress resonance effects in the filter.

2. The apparatus according to claim 1, wherein the link interface is configured to be connected to a Media Dependent Interface (MDI) that couples the Ethernet link to an Ethernet physical layer (PHY) transceiver.

3. The apparatus according to claim 1, wherein the at least two complementary inductors comprise a single complementary inductor.

4. The apparatus according to claim 1, wherein the at least two complementary inductors comprise multiple complementary inductors connected in series to one another.

5. The apparatus according to claim 1, wherein a ratio between an inductance of the primary inductor and an inductance of any of the at least two complementary inductors is at least five.

6. The apparatus according to claim 5, wherein the ratio is at least ten.

7. The apparatus according to claim 1, wherein the Ethernet link comprises a twisted-pair link having a first conductor and a second conductor, and wherein the filter comprises:
   wherein a first section, which comprises the primary inductor and the at least two complementary inductors, the first section configured to be coupled to the first conductor; and a second section, which comprises an additional primary inductor and one or more additional complementary inductors that match the primary inductor and the at least two complementary inductors, respectively, the second section configured to be coupled to the second conductor.

8. The apparatus according to claim 7, wherein the first section and the second section are disposed on a same substrate.

9. An automotive Ethernet communication device, comprising:
   a physical-layer (PHY) Ethernet transceiver, configured to communicate Ethernet signals over the Ethernet link; and
   the apparatus of claim 1.

10. An automotive Ethernet network, comprising the automotive Ethernet communication device of claim 9.

11. A method for filtering an electrical power signal in an Ethernet communication system, the method comprising:
   receiving the electrical power signal from a power-supply that supplies the electrical power signal for transfer over the Ethernet link, or providing the electrical power signal to a circuit that consumes the electrical power signal transferred over the Ethernet link; and
   applying to the electrical power signal a filter, which comprises at least a primary inductor, at least two complementary inductors connected in series with the primary inductor, and a resistor connected in parallel with the primary inductor, or in parallel with the at least two complementary inductors, including (i) filtering the electrical power signal by primary inductor, (ii) reducing a parasitic capacitance of the filter by the at least two complementary inductors, and suppressing resonance effects in the filter using the resistor.

12. The method according to claim 11, wherein receiving the electrical power signal comprises receiving the electrical power signal from a Media Dependent Interface (MDI) that couples the Ethernet link to an Ethernet physical layer (PHY) transceiver.

13. The method according to claim 11, wherein providing the electrical power signal comprises providing the electrical power signal to a Media Dependent Interface (MDI) that couples the Ethernet link to an Ethernet physical layer (PHY) transceiver.

14. The method according to claim 11, wherein the at least two complementary inductors comprise a single complementary inductor.

15. The method according to claim 11, wherein the at least two complementary inductors comprise multiple complementary inductors connected in series to one another.

16. The method according to claim 11, wherein a ratio between an inductance of the primary inductor and an inductance of any of the at least two complementary inductors is at least five.

17. The method according to claim 16, wherein the ratio is at least ten.

18. The method according to claim 11, wherein the Ethernet link comprises a twisted-pair link having a first conductor and a second conductor, and wherein the filter comprises:
wherein a first section, which comprises the primary inductor and the at least two complementary inductors, the first section configured to be coupled to the first conductor; and a second section, which comprises an additional primary inductor and one or more additional complementary inductors that match the primary inductor and the at least two complementary inductors, respectively, the second section configured to be coupled to the second conductor.

19. The method according to claim 18, wherein the first section and the second section are disposed on a same substrate.

* * * * *